US010767084B2

(12) United States Patent
Hedrick et al.

(10) Patent No.: US 10,767,084 B2
(45) Date of Patent: Sep. 8, 2020

(54) ENHANCED ADHESIVE MATERIALS AND PROCESSES FOR 3D APPLICATIONS

(71) Applicants: INTERNATIONAL BUSINESS MACHINES CORPORATION, Armonk, NY (US); James L. Hedrick, San Jose, CA (US); Robert Dennis Miller, San Jose, CA (US); Deborah Ann Neumayer, Yorktown Heights, NY (US); Sampath Purushothaman, Yorktown Heights, NY (US); Mary E. Rothwell, Yorktown Heights, NY (US); Willi Volksen, San Jose, CA (US); Roy R. Yu, Yorktown Heights, NY (US)

(72) Inventors: James L. Hedrick, San Jose, CA (US); Robert Dennis Miller, San Jose, CA (US); Deborah Ann Neumayer, Yorktown Heights, NY (US); Sampath Purushothaman, Yorktown Heights, NY (US); Mary E. Rothwell, Yorktown Heights, NY (US); Willi Volksen, San Jose, CA (US); Roy R. Yu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/004,028

(22) Filed: Jun. 8, 2018

(65) Prior Publication Data

US 2018/0340100 A1    Nov. 29, 2018

Related U.S. Application Data

(63) Continuation of application No. 14/967,353, filed on Dec. 13, 2015, now Pat. No. 9,994,741.

(51) Int. Cl.
*C09J 9/00* (2006.01)
*B32B 17/00* (2006.01)
(Continued)

(52) U.S. Cl.
CPC ............. *C09J 9/00* (2013.01); *C09J 11/04* (2013.01); *C09J 11/06* (2013.01); *C09J 179/04* (2013.01);
(Continued)

(58) Field of Classification Search
None
See application file for complete search history.

(56) References Cited

U.S. PATENT DOCUMENTS 5,347,428 A    9/1994   Carson et al.
5,432,729 A    7/1995   Carson et al.
(Continued)

FOREIGN PATENT DOCUMENTS

CN    103923462    7/2014
CN    1050655947   11/2015

OTHER PUBLICATIONS

H. B. Pogge et al., Proc. AMC 2001, pp. 129-136; M. Despont, et al; Transducers, Soldi-State Sensors, Actuators and Microsystems, 12th International Conference on, 2003, vol. 2, Jun. 8-12, 2003, pp. 1907-1910.
(Continued)

*Primary Examiner* — Tae H Yoon
(74) *Attorney, Agent, or Firm* — Daniel Morris; Otterstedt, Wallace & Kammer, LLP

(57) ABSTRACT

The present invention related to CNT filled polymer composite system possessing a high thermal conductivity and high temperature stability so that it is a highly thermally conductive for use in 3D and 4D integration for joining device sub-laminate layers. The CNT/polymer composite (Continued)

also has a CTE close to that of Si, enabling a reduced wafer structural warping during high temperature processing cycling. The composition is tailored to be suitable for coating, curing and patterning by means conventionally known in the art.

20 Claims, 12 Drawing Sheets

(51) Int. Cl.
| | |
|---|---|
| C09J 179/08 | (2006.01) |
| C09J 11/04 | (2006.01) |
| H01L 23/16 | (2006.01) |
| B32B 33/00 | (2006.01) |
| C09J 11/06 | (2006.01) |
| C09J 179/04 | (2006.01) |
| C09J 183/04 | (2006.01) |
| H01L 23/00 | (2006.01) |
| H01L 25/065 | (2006.01) |
| H01L 25/00 | (2006.01) |
| H01L 21/768 | (2006.01) |
| H01L 21/683 | (2006.01) |
| H01L 23/60 | (2006.01) |
| H01L 23/48 | (2006.01) |
| B82Y 30/00 | (2011.01) |
| B82Y 40/00 | (2011.01) |
| C08K 5/544 | (2006.01) |
| C08K 5/548 | (2006.01) |
| C08K 5/5425 | (2006.01) |
| C08K 5/5465 | (2006.01) |
| C08K 7/24 | (2006.01) |
| C08K 3/04 | (2006.01) |

(52) U.S. Cl.
CPC ........... *C09J 179/08* (2013.01); *C09J 183/04* (2013.01); *H01L 21/6835* (2013.01); *H01L 21/76898* (2013.01); *H01L 23/481* (2013.01); *H01L 23/60* (2013.01); *H01L 24/00* (2013.01); *H01L 24/13* (2013.01); *H01L 24/27* (2013.01); *H01L 24/29* (2013.01); *H01L 24/33* (2013.01); *H01L 24/73* (2013.01); *H01L 24/81* (2013.01); *H01L 24/83* (2013.01); *H01L 24/92* (2013.01); *H01L 24/94* (2013.01); *H01L 25/0657* (2013.01); *H01L 25/50* (2013.01); *B82Y 30/00* (2013.01); *B82Y 40/00* (2013.01); *C08K 3/041* (2017.05); *C08K 5/544* (2013.01); *C08K 5/548* (2013.01); *C08K 5/5425* (2013.01); *C08K 5/5465* (2013.01); *C08K 7/24* (2013.01); *C08K 2201/01* (2013.01); *H01L 24/11* (2013.01); *H01L 24/16* (2013.01); *H01L 24/32* (2013.01); *H01L 2221/68327* (2013.01); *H01L 2221/68363* (2013.01); *H01L 2224/05624* (2013.01); *H01L 2224/05647* (2013.01); *H01L 2224/05684* (2013.01); *H01L 2224/11831* (2013.01); *H01L 2224/1369* (2013.01); *H01L 2224/13147* (2013.01); *H01L 2224/13184* (2013.01); *H01L 2224/13562* (2013.01); *H01L 2224/13565* (2013.01); *H01L 2224/16147* (2013.01); *H01L 2224/27444* (2013.01); *H01L 2224/27452* (2013.01); *H01L 2224/27612* (2013.01); *H01L 2224/2929* (2013.01); *H01L 2224/29393* (2013.01); *H01L 2224/29499* (2013.01); *H01L 2224/32145* (2013.01); *H01L 2224/73204* (2013.01); *H01L 2224/81005* (2013.01); *H01L 2224/81141* (2013.01); *H01L 2224/81191* (2013.01); *H01L 2224/81201* (2013.01); *H01L 2224/81903* (2013.01); *H01L 2224/83005* (2013.01); *H01L 2224/8385* (2013.01); *H01L 2224/83192* (2013.01); *H01L 2224/83201* (2013.01); *H01L 2224/83855* (2013.01); *H01L 2224/83856* (2013.01); *H01L 2224/83895* (2013.01); *H01L 2224/9202* (2013.01); *H01L 2224/9211* (2013.01); *H01L 2224/94* (2013.01); *H01L 2225/06544* (2013.01); *Y10S 977/742* (2013.01); *Y10S 977/833* (2013.01); *Y10S 977/843* (2013.01)

(56) References Cited

U.S. PATENT DOCUMENTS

| | | |
|---|---|---|
| 5,502,667 A | 3/1996 | Bertin et al. |
| 5,561,622 A | 10/1996 | Bertin et al. |
| 5,702,884 A | 12/1997 | Bertin et al. |
| 5,804,004 A | 9/1998 | Tuckerman et al. |
| 6,090,633 A | 7/2000 | Yu et al. |
| 6,281,452 B1 | 8/2001 | Prasad et al. |
| 6,329,609 B1 | 12/2001 | Kaja et al. |
| 6,355,501 B1 | 3/2002 | Fung et al. |
| 6,356,501 B2 | 3/2002 | Fung et al. |
| 6,388,317 B1 | 5/2002 | Reese |
| 6,407,922 B1 | 6/2002 | Eckblad |
| 6,444,560 B1 | 9/2002 | Pogge et al. |
| 6,473,308 B2 | 10/2002 | Forthun |
| 6,599,778 B2 | 7/2003 | Pogge et al. |
| 6,600,224 B1 | 7/2003 | Farquhar et al. |
| 6,640,021 B2 | 10/2003 | Pogge et al. |
| 6,652,958 B2 | 11/2003 | Tobita |
| 6,678,849 B1 | 1/2004 | Prasad et al. |
| 6,717,061 B2 | 4/2004 | Yamaguchi et al. |
| 6,737,297 B2 | 5/2004 | Pogge et al. |
| 6,821,826 B1 | 11/2004 | Chan et al. |
| 6,835,589 B2 | 12/2004 | Pogge et al. |
| 6,856,025 B2 | 2/2005 | Pogge et al. |
| 6,864,165 B1 | 3/2005 | Pogge et al. |
| 6,908,792 B2 | 6/2005 | Bruce et al. |
| 7,005,730 B2 | 2/2006 | Verma et al. |
| 7,049,697 B2 | 5/2006 | Pogge et al. |
| 7,056,813 B2 | 6/2006 | Morrow et al. |
| 7,071,031 B2 | 7/2006 | Pogge et al. |
| 7,071,546 B2 | 7/2006 | Fey et al. |
| 7,132,754 B1 | 11/2006 | Schmidt |
| 7,151,009 B2 | 12/2006 | Kim et al. |
| 7,170,164 B2 | 1/2007 | Chen et al. |
| 7,193,304 B2 | 3/2007 | Kuo et al. |
| 7,230,334 B2 | 6/2007 | Andry et al. |
| 7,291,396 B2 | 11/2007 | Huang et al. |
| 7,307,003 B2 | 12/2007 | Reif et al. |
| 7,312,487 B2 | 12/2007 | Alam et al. |
| 7,355,277 B2 | 4/2008 | Myers et al. |
| 7,494,910 B2 | 2/2009 | Mouli et al. |
| 7,581,645 B2 | 9/2009 | Ho et al. |
| 8,512,840 B2 | 8/2013 | Wu |
| 8,632,879 B2* | 1/2014 | Weisenberger .......... C08J 5/005 |
| | | 428/332 |
| 8,951,632 B2 | 2/2015 | Shah et al. |
| 9,064,717 B2 | 6/2015 | Purushothaman et al. |
| 9,815,987 B2* | 11/2017 | Hasegawa ............ H01M 4/587 |
| 9,994,741 B2 | 6/2018 | Hedrick et al. |
| 10,138,120 B2* | 11/2018 | Hart ...................... B29C 70/14 |
| 2006/0091557 A1 | 5/2006 | Sakamoto |
| 2007/0116626 A1* | 5/2007 | Pan ..................... H01L 21/4871 |
| | | 423/447.1 |
| 2008/0001284 A1 | 1/2008 | Yuen et al. |
| 2008/0292840 A1* | 11/2008 | Majumdar ................ B32B 3/14 |
| | | 428/114 |
| 2009/0032496 A1 | 2/2009 | Yao et al. |
| 2009/0068387 A1 | 3/2009 | Panzer et al. |
| 2009/0123731 A1 | 5/2009 | Shimizu |
| 2009/0125953 A1 | 8/2009 | Hwang |
| 2009/0215953 A1 | 8/2009 | Hwang et al. |

(56) References Cited

U.S. PATENT DOCUMENTS

| | | |
|---|---|---|
| 2009/0218681 A1 | 9/2009 | Chrysler et al. |
| 2009/0269498 A1 | 10/2009 | Liao et al. |
| 2009/0269560 A1 | 10/2009 | Dhinojwala et al. |
| 2009/0269604 A1 | 10/2009 | Wang et al. |
| 2010/0051331 A1 | 3/2010 | Tsai et al. |
| 2010/0119822 A1* | 5/2010 | Hwang ................. B82Y 30/00 428/364 |
| 2012/0077398 A1 | 3/2012 | Gaillard et al. |
| 2013/0176659 A1* | 7/2013 | Hata ...................... H01G 11/36 361/502 |
| 2016/0297935 A1 | 10/2016 | Reese et al. |
| 2016/0311970 A1* | 10/2016 | Claverie ................. C08F 32/08 |
| 2019/0378781 A1 | 12/2019 | Hedrick et al. |

OTHER PUBLICATIONS

K. W. Guarini, et al; IEMD 2002 pp. 943-945.
Roy Yu, Proc. VMIC 2007, p. 223, 2007.
P. Kogge et al., ExaScale Computing Study: Technology Challenges in Achieving Exascale Systems; Information Processing Techniques Office, Air Force Research Laboratory, Sep. 28, 2008; pp. 159, 161.
Hedrick et al, unpublished U.S. Appl. 16/750,719, filed Jan. 23, 2020, Enhanced Adhesive Materials and Processes for 3D Applications, pp. 1-32 plus 12 sheets of drawings.
Paul J. Otterstedt, List of IBM Patents or Patent Applications Treated as Related, Apr. 20, 2020, pp. 1-2.

* cited by examiner

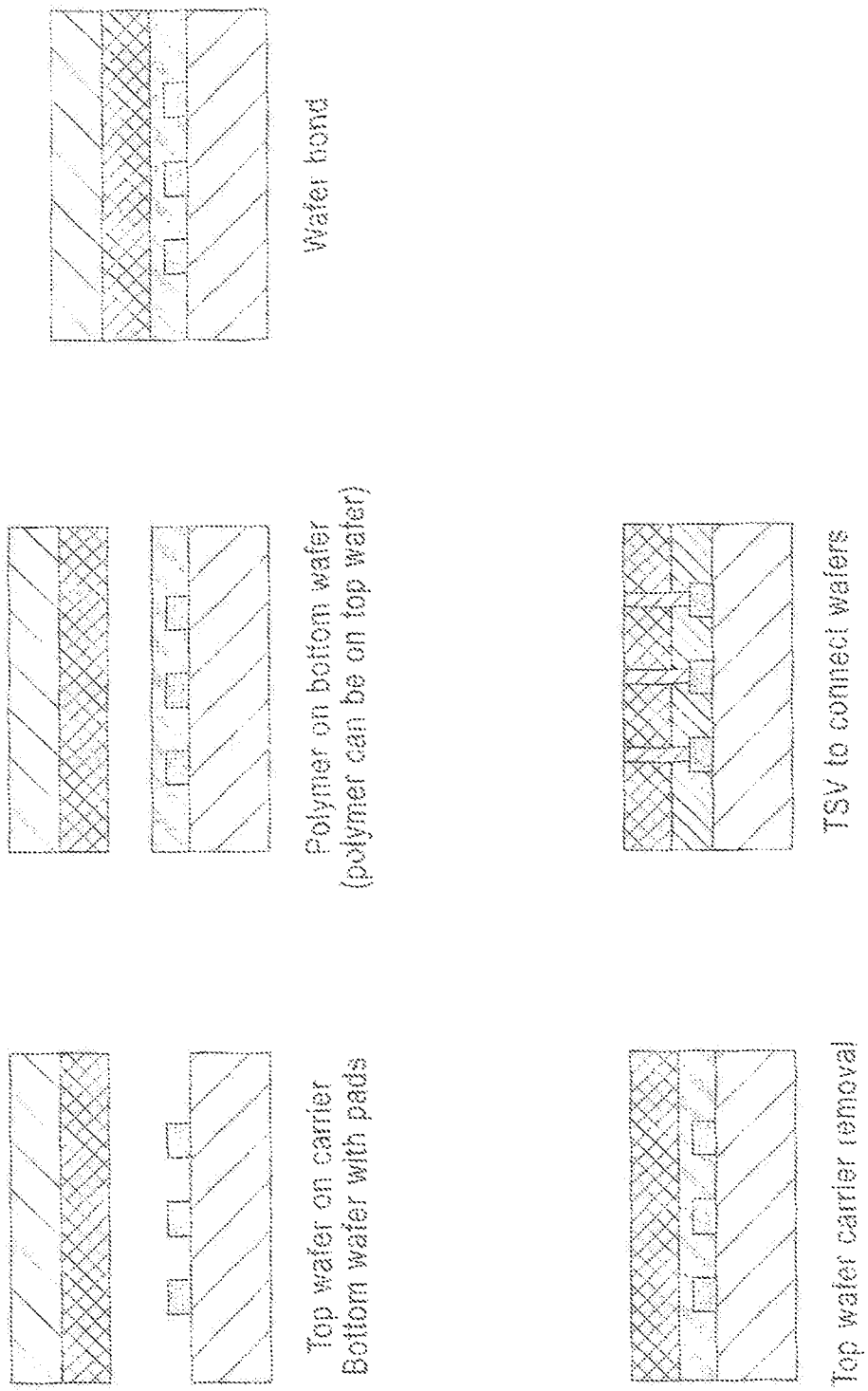

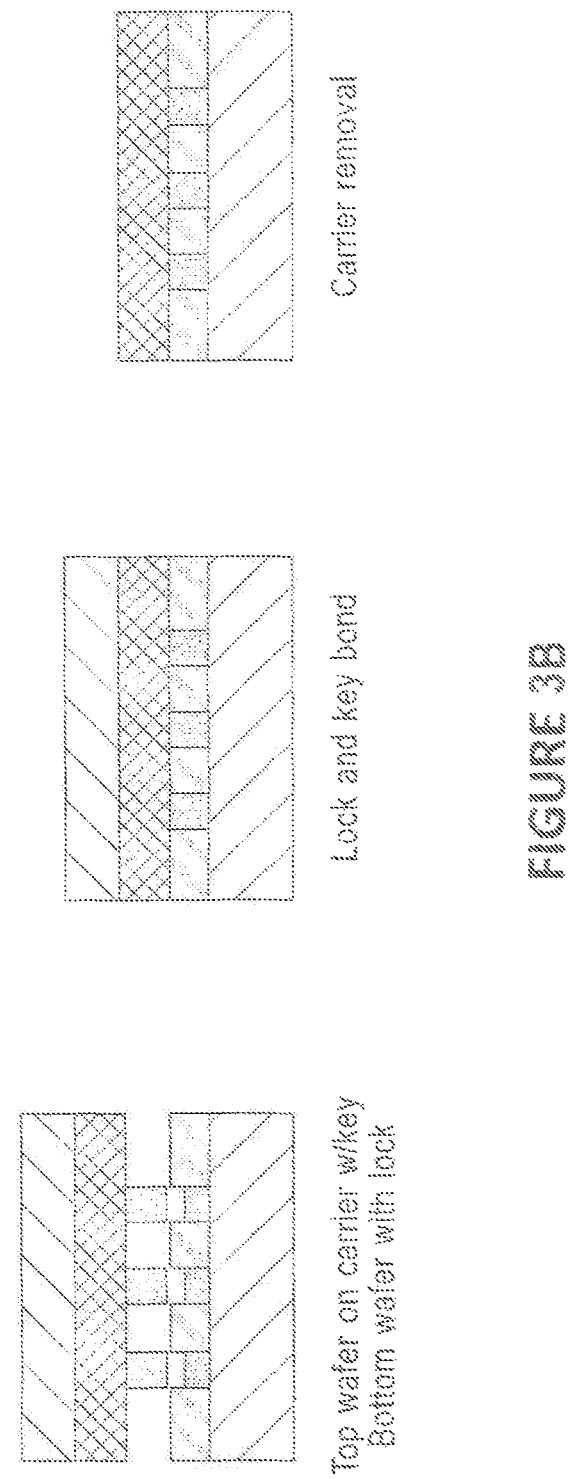

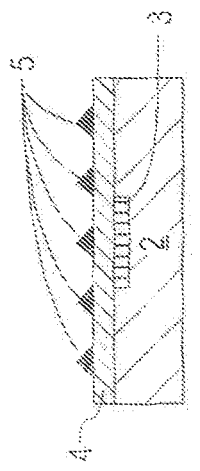
FIGURE 7
Base wafer with contact
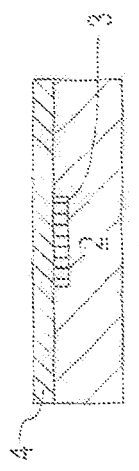
FIGURE 8
Insulation
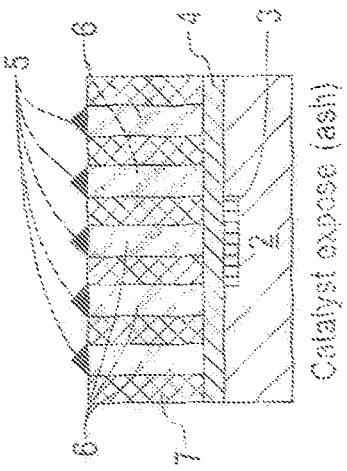
FIGURE 9
Catalyst seeding
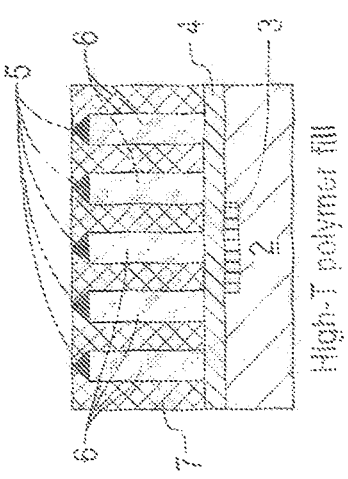
FIGURE 10
CNT growth
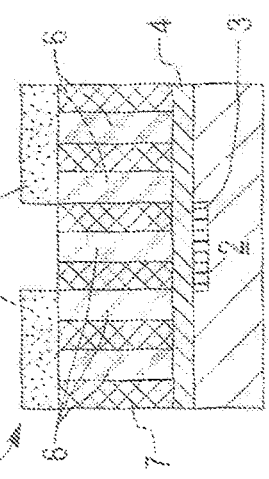
FIGURE 11
High-T polymer fill
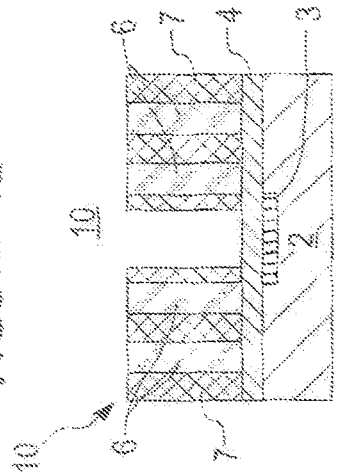
FIGURE 12
Catalyst expose (ash)
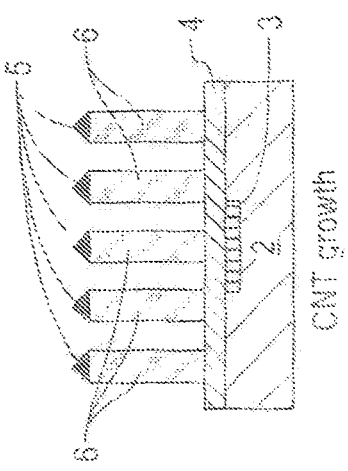
FIGURE 13
Catalyst removal (etch)
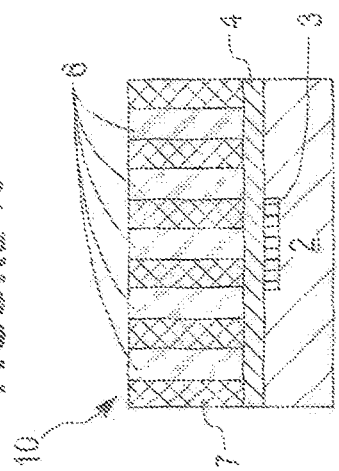
FIGURE 14
Litho pattern
FIGURE 15
RIE to open contact

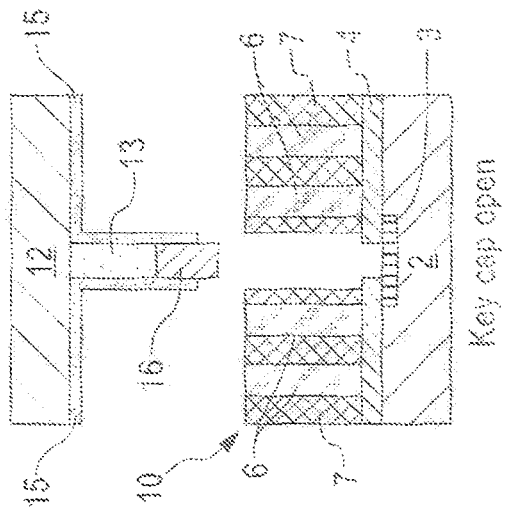
FIGURE 16 Lock-n-key
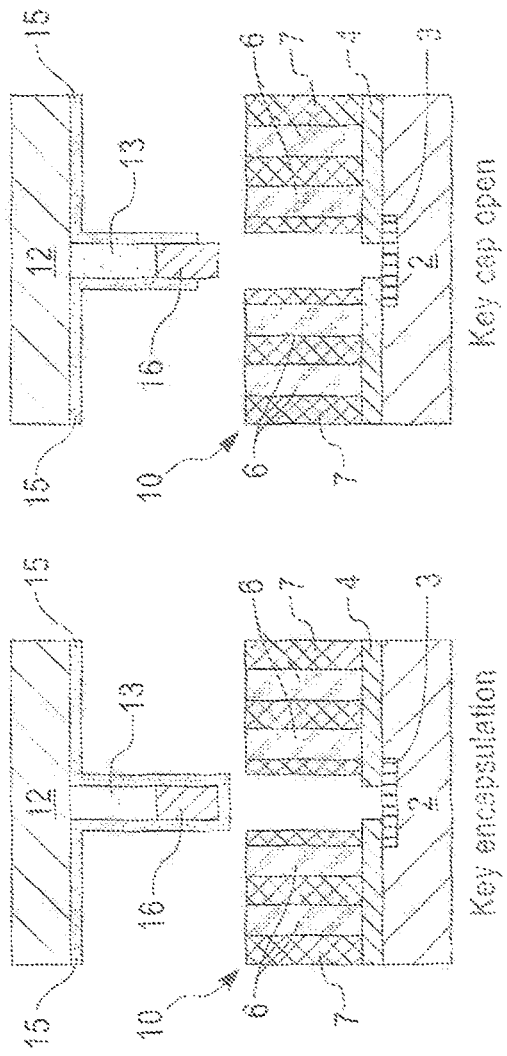
FIGURE 17 Key encapsulation
FIGURE 18 Key cap open
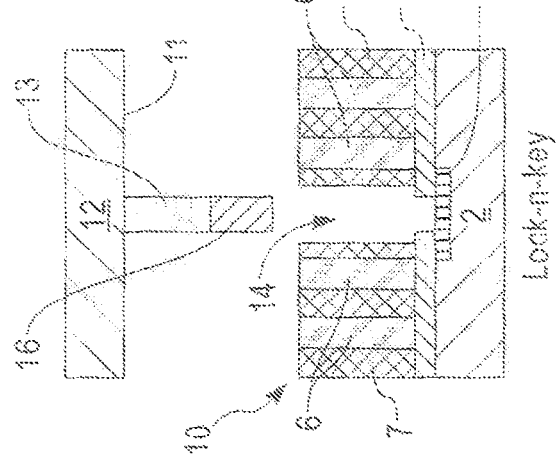
FIGURE 19 Key and lock mate
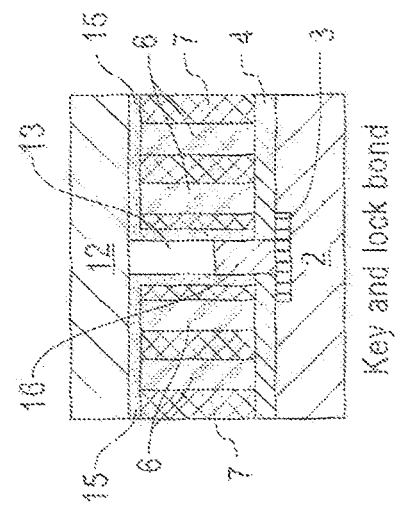
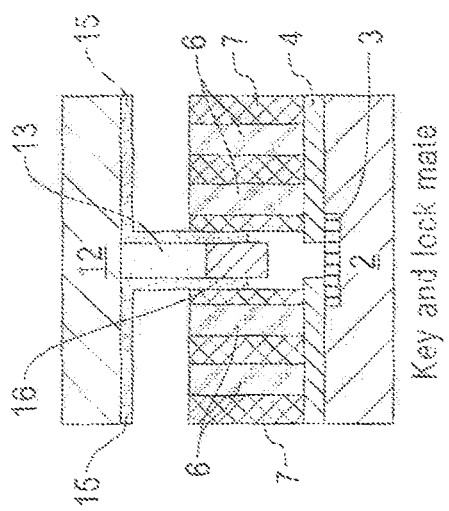
FIG. 20 Key and lock bond

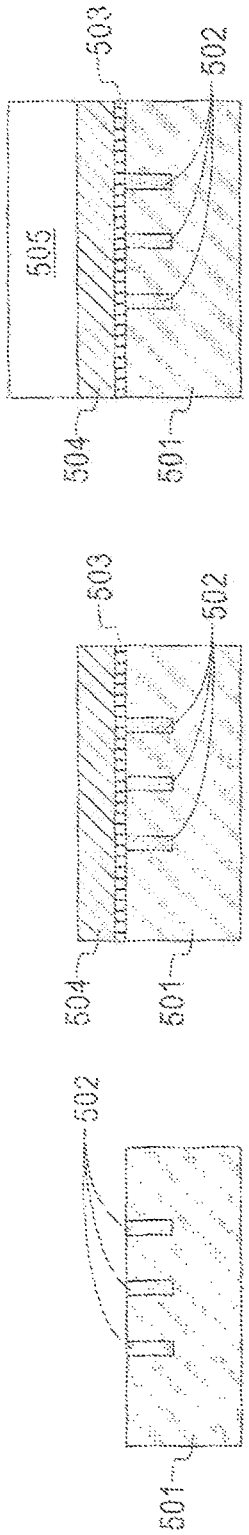

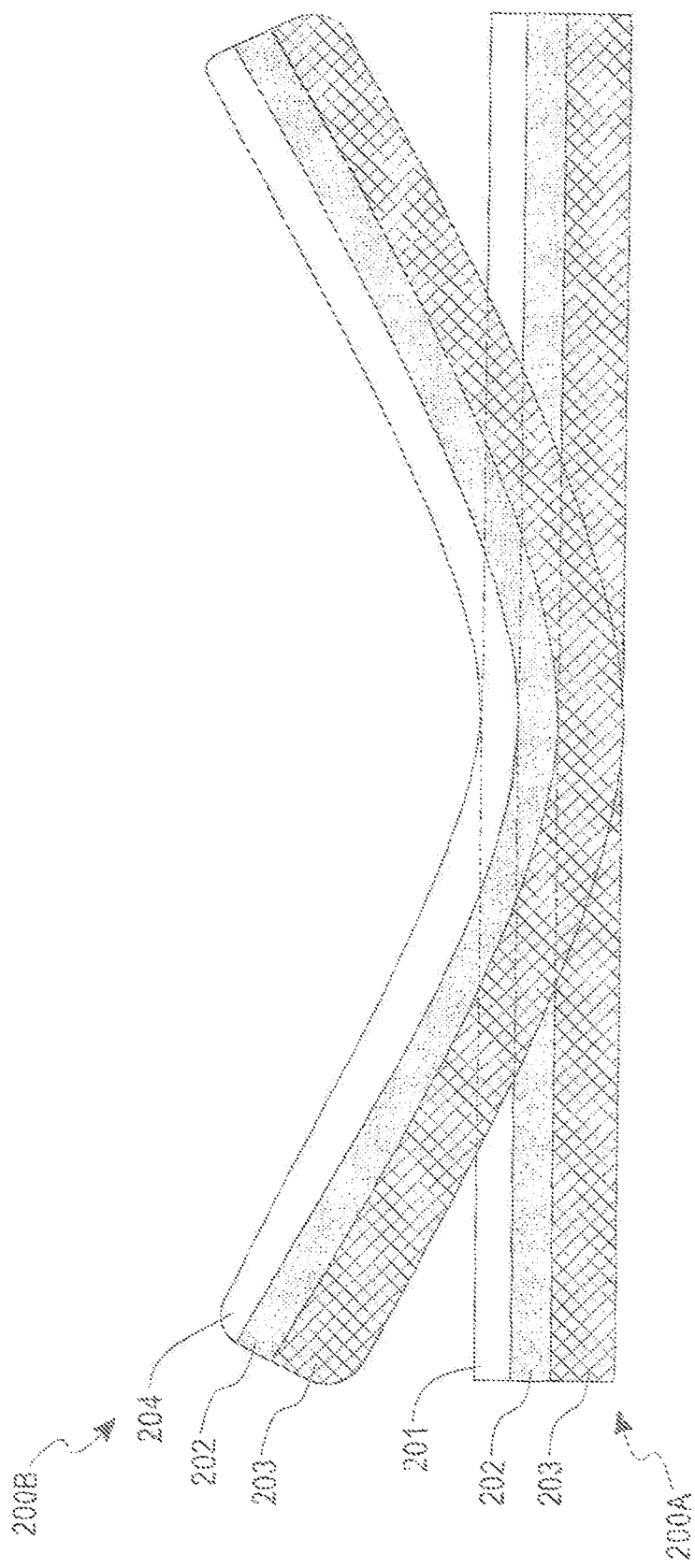

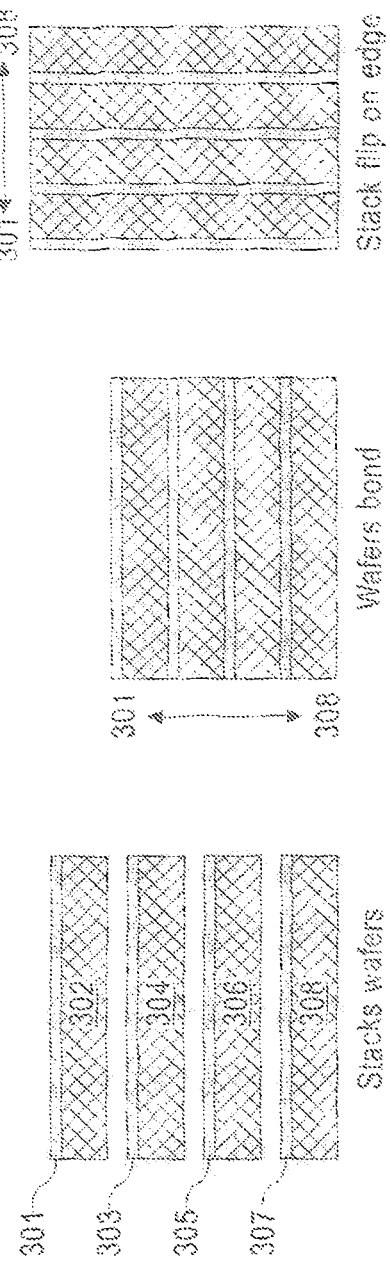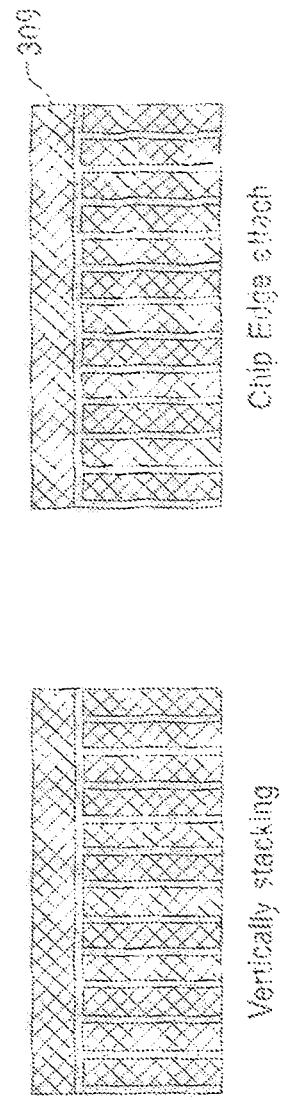
FIGURE 29 Stacks wafers
FIGURE 30 Wafers bond
FIGURE 31 Stack flip on edge
FIGURE 32 Vertically stacking
FIGURE 33 Chip Edge etch

ENHANCED ADHESIVE MATERIALS AND PROCESSES FOR 3D APPLICATIONS

CROSS-REFERENCE TO RELATED APPLICATION

This application is a continuation of U.S. patent application Ser. No. 14/967,353 filed Dec. 13, 2015, now U.S. Pat. No. 9,994,741.

FIELD OF THE INVENTION

The present invention related to enhanced adhesive materials and processes for three-dimensional, and four-dimensional integration applications.

DESCRIPTION OF THE PRIOR ART

In electronic engineering, a through-silicon (TSV) is a vertical electrical connection (via) (Vertical Interconnect Access) passing completely through a silicon wafer or die. TSVs are a high performance technique used to create 3D packages and 3D integrated circuits, compared to alternatives such as package-on-package, because the density of the vias is substantially higher, and because the length of the connections is shorter.

Through Silicon Via (TSV) is an enabling technology that allows electrical connections to be formed through a silicon wafer or multi-wafer devices. Electrical connections through a silicon wafer allow for reduced die footprints and inter-layer connectivity. When combined with Wafer Level Packaging (WLP), TSVs minimize die size, allow conventional or flip-chip bonding, and help minimize cost of the final macroscale device.

In microelectronics, a "three dimensional integrated circuit" (3DI) or a four-dimensional integrated circuit (4DI) comprises an integrated circuit in which silicon wafer and/or dies are stacked by interconnecting them vertically using TSVs so that they behave as a single device to achieve performance improvements. These integrated circuits possess a higher device density at reduced power and a smaller footprint than conventional two dimensional circuits as processed.

3DI integration comprises a device system integration method that brings heterogeneous devices together in close proximity so that they function as a homogeneous device. 3DI is different than traditional 2D planar back-end-of-line (BEOL) integration in that 3DI adds an additional dimension, (Z) integration, which not only allows more devices from different sources and types to be integrated into the system in close proximity, but also enables them to function as a unit.

More particularly, 3DI and 4DI integration involves stacking silicon device layers with their associate local and short length interconnects and using bonded metal to metal joints to enable communication between the layers.

The 3D interconnection methods can be broadly categorized into chip stacking and wafer stacking.

The conventional chip stacking method comprises building through-Si vias (TSV) at wafer level but singulating the chips prior to stacking them. This approach is similar to that of flip chip joining with solder bumps connect between chips.

The underfill polymer is then filled between the solders bumps to reinforce the chip-chip interface. This invention is not suitable for 3DI chip stacking.

There are three (3) main types of wafer stacking (i.e., wafer level 3DI) interconnecting methods. The methods used vary the order of TSV and wafer level bonding sequence.

The 3D interconnecting methods for producing wafer level 3DI comprise:

1.) Oxide-oxide bond with via-last. In this method, depicted in FIG. 1, the entire bulk Si is removed from the top wafer and the bottom of th top wafer is bonded to the top of the bottom wafer through a thin oxide-oxide interface. The TSV is added after the wafers are bonded. This method is sometime referred to as "device transfer."

The device layer in this method is normally very thin.

2.) Metal-metal (Cu—Cu) bond with vias-first. In this method partially depicted in FIG. 2, TSV vias in the top wafer are formed first and bonding metals are added at the bonding interfaces of the two bonding wafers. There is no dielectric used in the interface. Because of the space between the metal contacts the reliability of the bonding interface may be compromised.

3.) A more commonly adapted wafer level 3DI bonding is to use a high temperature polymer as a bonding layer between the wafers. In this way the top wafer can be kept thick to preserve the quality of the top device. This method is also more flexible and can be either TSV-last or TSV-first as detailed below.

3A.) In the case of TSV-last, as depicted in FIG. 3A, a blanket polymer is used to bond the two wafers with the wafers in the thickness range of 10 μm-350 μm. The TSV are then added from the top wafer through the bonding interface to the bottom wafer after the wafers are bonded to connect the two wafers.

3B.) In the case of TSV-first (also referred to as lock-and-key) bonding, as depicted in FIG. 3B, the TSV is processed in the top wafer first. The bonding interface is a polymer and metal bonding composite structure with the metal for electrical contact and dielectric polymer seals the metal contacts. The structure allows the metal and dielectric bonded together in one step with precision locked-in alignment. A more detailed discussion of the method for preparing this structure is disclosed hereinafter.

In addition to above mentioned 3DI stacking, polymer bonding is also frequently used in:

4) Wafer/chip temporary carrier bonding. In order to have a dense and small TSV array through the Si bulk wafer, the TSVs typically have a limited depth. For example, at 2-5 μm size, the depth of a TSV is normally at about 20-50 μm, which requires the wafer to be thinned to the depth of TSV prior to wafer-wafer bonding.

A 20-50 μm thick wafer is very difficult to be processed stand-alone. A temporary carrier (normally glass plate or a Si wafer) is used in such case and is bonded to the top of the wafer as a "handler" to facilitate the thinning and handling during the subsequent processing. After the thinned top wafer is bonded to a "thick" bottom wafer, this "carrier" or "handler" glass is removed. The layer between the handler and the thinned wafer is typically a polymer layer and is called temporary bond layer. This layer is "consumable" as it is only used during the processing and is removed from the final structure at a later stage. A high temperature polymer as a temporary bonding layer with good thermal conduction and reduced thermal expansion helps the thin top wafer when undergoing high temperature processing as well as helping it maintain structural flatness.

5) 4DI. More recently, a more advanced type wafer stack structure, 4DI, has been proposed and practiced by IBM as disclosed in U.S. Pat. No. 8,247,895. Instead of stacking the wafers horizontally as in the 3DI system noted above, the method disclosed in the reference stacks the chips vertically as well as horizontally, thus greatly simplifying the stacking process and increasing the density.

U.S. Pat. No. 6,355,501 illustrates a via-first configuration on element 100, where the level-level connection is through imbedded vias. (Since via-first does not impact the wiring levels for the top wafer, the wiring density is normally higher for the via-first approach). The interface contact is through mechanical means so the interface via density is typically about 5 to about 10 um (micron) at the best. U.S. Pat. No. 7,312,487 illustrates the via-last option, element 172, where the wafers are stacked first and then vias are formed through the entire top wafer.

Since the vias are lithographically defined, this via-last has a higher density of via counts, at about 1 um. Since the Through-Si vias in the top wafer take up wiring channels, the wiring density is reduced for via-last.

Since the through-Si vias in the top wafer take up wiring channels, the wiring density is reduced for via-last, about 10 μm pitch. For 3DI with via-last approach, the wiring density typically is reduced due to the use of the wiring channels by the through-Si vias through the entire device stack (via first allows z-wiring and reduces the loss of channels). Since the through-Si vias can be defined lithographically, via-last normally have a higher via-density (under about 1 um pitch) than via-first approach (about 5 to about 10 μm pitch).

In all 3DI integration schemes mentioned above, the cooling of the system is typically a difficult issue to resolve. The tighter stacks of devices generate more heat density but with reduced heat dissipation. Some work in micro-channels cooling for 3DI only limits the cooling through surface layer and is difficult to achieve an effective cooling with more stacks involved in the 3D systems.

One particular issue associated with 3DI through-Si connections comprises the ESD (electro-static discharge) protection load. In any device production an EDS protection circuitry is designed and linked to a I/O net. This is to protect it from manufacturing process ESD. Since each wafer for 3DI needs their ESD the final 3DI circuits will have a total ESD as large as the sum of all the devices in the 3DI device. This can be a large load as the number of devices increase and requires a large driver to access the 3DI circuits which could significantly slow them down.

In 3DI by either chip stacking or through-Si connection, the heating density increases as the number of 3DI devices increase. This limits the number of 3DI devices as the heat dissipation become a road block for further 3D content increase.

A less obvious but equally important issue is the thermal expansion and thermal stress mismatch in the 3DI stacks. A wafer must remain flat (<50 um flatness) globally for it to be acceptable in the tools for processing. If the coefficient of thermal expansion (CTE) of the Si layers and the bonding adhesive differ, then the wafer global flatness/stress will also change at different temperatures. The larger the wafer size (150 mm, 200 mm, 300 mm, even 450 mm) the greater the impact on the wafer global flatness/stress due to coefficient of thermal expansion (CTE) mismatch. By way of illustration, pertinent CTE values are: Si=3.0, oxide=3.5, Metals=20, polymers=50.

U.S. Pat. Nos. 5,702,984; 5,432,729; 5,561,622; 5,502,667; 5,347,428; 6,717,061; and 7,193,304 illustrate edge connection details of some of the chip stacking methods. Note that all chip stacking methods have no cooling channels proposed and have signal and power accesses only through wire-bonding.

U.S. Pat. Nos. 7,132,754; 6,908,792; and 6,473,308 illustrate chip staking by wrap-around with a signal bus. This type connection also had long I/O length. U.S. Pat. Nos. 7,193,304; 7,151,009; 7,071,546; 7,005,730; 6,355,501 (metal/oxide); U.S. Pat. No. 6,821,826 (oxide-oxide); U.S. Pat. Nos. 5,804,004; 7,312,487; 7,307,003; and 7,056,813 illustrate common Through-Si via connections.

U.S. Pat. No. 6,355,501 illustrates a via-first configuration on element 100, where the level-level connection is through imbedded vias. Since via-last does not impact the wiring levels for the top wafer, the wiring density is normally higher for the via-first approach.

The interface contact is through mechanical means so the interface via density is typically about 5 to about 10 um at the best. U.S. Pat. No. 7,312,487 illustrates the via-last option, element 172, where the wafers are stacked first and then vias are formed through the entire top wafer. Since the vias are lithographically defined, this via-last has a higher density of via counts, at about 1 um. Since the Through-Si vias in the top wafer take up wiring channels, the wiring density is reduced for via-last.

U.S. Pat. Nos. 7,355,277; 7,230,334; 7,170,164; and 6,388,317 illustrate micro-channels cooling.

U.S. Pat. Nos. 6,864,165; 6,856,025; 6,599,778; 7,071,031; 6,835,589; 6,640,021; 7,049,697; 6,737,297; 6,444,560; 6,329,609; 6,600,224; 6,090,633; 6,678,949; and 6,281,452 illustrate T&J 3DI polyimide stud via joining connections (lock and key) on chip devices.

The scientific literature also describe some of these devices and processes for making them, and include: H. B. Pogge et al., *Proc. AMC* 2001, pp. 129-1366; M. Despont, et al; *TRANSDUCERS, Solid-State Sensors, Actuators and Microsystems,* 12th International Conference on, 2003, Volume 2, 8-12 Jun. 2003, pp. 1907-1910;

K. W. Guarini, et al; IEMD 2002 pp. 943-945 R. Yu, Proc. VMIC 2007, p. 223, 2007. P. Kogge et al., *ExaScale Computing Study: Technology Challenges in Achieving Exascale Systems*; Information Processing Techniques Office, Air Force Research Laboratory, Sep. 28, 2008; pp. 159, 161.

These prior art devices and methods of assembling and using them have proved successful, however, they also present several issues, such as for example in chip stacking, edge connection leads to signal delay, lower I/O density, difficulties in powering the system and difficulties in cooling the system in high power applications.

Similarly, the current through-Si 3D wafer stacking processes and resultant devices present issues, e.g., thin Si construction (20 um) requires stacking wafers one at a time to allow through-Si vias; it is difficult to make the via less than 5 μm in size and 10 μm in pitch in devices employing Cu; through-Si vias can be made from W but W has a higher resistivity than Cu; through-via pass through the bonding interface making bonding defects difficult to control; wafer stacks are limited due to bonding thermal cycles; the process is complex and introduces via yield and wafer yield issues; manufacturing involves long process cycles; wafer level distortions are introduced; it is difficult to cool the system; and it is difficult to dissipate power.

4.) More recently, a vertically stacked 3DI with additional edge control chip, called 4DI, become feasible. This 4DI structure allows a much better arrangement of functional blocks in devices and higher integration density.

The present invention relates to a wafer level 3DI using polymer bonding as described in paragraphs 3A and 3B above and 4DI integration as described in paragraph 4 above.

The bonded metal to metal joints mentioned above, replace most of the long length interconnects often required for interconnection of device macros on processor chips. As the majority of the joined interface area between the two device layers is not metallic and comprises primarily dielectric materials, additional bonding means are required for structural integrity and prevention of environmental ingress into the metal to metal bond locations.

Adhesives which can provide good bond strength as well as filling of any gaps between the bonded layers to prevent influx of the environment is highly desirable. As some of the final interconnects and the input-output connections from the chip are to be fabricated after the bonding is completed, the adhesive used has to be compatible with moderately high temperature exposures in the 350° C. to 425° C. range typical of these additional steps. Most of the commercially available adhesives are not able to withstand these temperature excursions.

In addition to being compatible with moderately high temperatures as noted above, a second requirement for these adhesives, is that it must possess a good thermal conductivity to dissipate the heat generated by the operation of the silicon devices in and through the upper layers of the stacked structure to the cooling cap. As thermoplastic and thermoset polymers, in general, area poor thermal conductors, thermal conductivity is a concern when adhesive bonding issued to secure metal to metal joints. Increasing metal contact area is one way to increase the average thermal conduction but the total metal contact area is limited to 17% in the best case.

Fill materials can be used to enhance thermal conductivity but these have to be compatible with the coating, curing the patterning of the filled polymer composite required in the preparation of the sublaminates that are bonded together. Most of the commercially available filled polymer pastes are not readily applicable for this purpose. By way of example, flip chip underfill materials are typically glass spheres in epoxy resin. The glass spheres help thermal conduction but epoxy is only stable to 200°-250° C. before decomposition).

The enhanced adhesive material used in accordance with present invention comprises specific polymer resins blended with and containing carbon nanotubes (CNT). The novel adhesive serves to bond metal joints found in the 3D integrated circuits and to act as a thermal transfer agent.

The prior art discloses references that relate to the use of CNTs but none that disclose the combination found in the present invention.

U.S. Pat. No. 7,581,645 discloses a method of making carbon nanotubes.

U.S. Pat. No. 7,291,396 discloses a thermal interface material that includes a matrix and carbon nanotubes. The matrix includes a first surface and an opposite second surface. The carbon nanotubes are embedded in the matrix uniformly and extend from the first surface to the second surface, and each carbon nanotube has two opposite ends. At least one of the two opposite ends of the carbon nanotubes are exposed out of one of the first and second surfaces of the matrix. The exposed ends of the carbon nanotubes are elastically bent/embedded in a phase change layer formed thereof. The polymer matrix in the reference is employed for thermal dissipation purposes and is not used as an adhesive to bond metal joints present in a 3D integrated circuit.

United States Patent Application Disclosure 2010/0051331 discloses a composite layer that includes a polymer matrix and carbon nanotubes embedded in the polymer matrix. Each of the carbon nanotubes extends from a first surface of the matrix to the second surface inclined at a specific range of angles relative to the first surface. The polymer matrix in the reference is employed for thermal dissipation purposes and is not used as an adhesive to bond metal joints present in a 3D integrated circuit.

United States Patent Application Disclosure 2008/0292840 discloses a two-sided carbon nanostructure thermal interface material having a flexible polymer matrix and an array of vertically aligned carbon nanostructures on a first surface of the flexible polymer matrix; and an array of vertically aligned carbon nanostructures on a second surface of the flexible polymer matrix, wherein the first and second surfaces are opposite sides of the flexible polymer matrix. The two surfaces are adhered using the carbon nanostructure as a dry adhesive. The dry adhesive operates by van der Waals forces acting at the distal ends of the carbon nanostructures, thereby holding different objects or surfaces together.

The cited reference does not disclose that the adhesive is a physical blend of a polymer and a CNT used to bond metal joints present in a 3D integrated circuit.

United States Patent Application Disclosure 2009/0269560 is directed to a carbon nanostructure composite dry adhesive tape system wherein carbon nanotubes are partially embedded and stabilized within a flexible substrate or matrix. The matrix polymers are not the ones used in the present invention.

U.S. Pat. Nos. 7,291,306 and 7,581,645 and United States Patent Application Publication No. 2009/0032496 each disclose methods of making CNTs but do not disclose the use of polymer/CNT composite as an adhesive to bond metal joints present in a 3D integrated circuit.

CNT, with a slightly negative CTE of $(-3) \times 10^{-6}$/K, combines with a polymer with a CTE of $(+50) \times 10^{-6}$/K, can yield a composite TCE nears that of Si $(3 \times 10^{-6}$/K), reducing global bending.

SUMMARY OF THE INVENTION

The present invention relates to CNT filled polymer composite system possessing a high thermal conductivity and high temperature stability so that it is a highly thermally conductive for use in 3D and 4D integration for joining device sub-laminate layers. The CNT/polymer composite also has a CTE close to that of Si, enabling a reduced wafer structural warping during high temperature processing cycling. The composition is tailored to be suitable for coating, curing and patterning by means conventionally known in the art.

DESCRIPTION OF THE DRAWINGS

FIG. 3A depicts a chip stacking method building through-Si vias (TSV) last.

FIG. 3B depicts a chip stacking (lock and key bonding) method building through-Si vias (TSV) first.

FIG. 7 is a base wafer and contact embedded therein.

FIG. 8 is the base wafer and contact covered with an insulation layer.

FIG. 9 shows catalyst seeding on the insulation layer.

FIG. 10 shows a plurality of CNT columns beneath the catalyst.

FIG. 11 shows the CNTs immersed in a high-temperature polymer fill.

FIG. 12 shows the catalyst exposed after removal of a portion of the high-temperature polymer fill.

FIG. 13 shows the composite structure with catalyst removed.

FIG. 14 shows a patterned resist covering the composite structure.

FIG. 15 shows the composite structure etched to the contact.

FIG. 16 shows a wafer and descending key.

FIG. 17 shows the key encapsulated with an insulating oxide layer.

FIG. 18 shows the insulation at the tip of the Key removed.

FIG. 19 shows lock and key mate.

FIG. 20 shows the finished product of wafers.

FIG. 21-27 show the sequence of steps of making an assembly used in a 3DI wherein the adhesive CNT/polymer composite is used on a temporary and permanent basis.

FIG. 28 shows a wafer subject to bending due to CTE difference and stress in the stacking during processing temperature cycling.

FIGS. 29-33 show the steps used when making a 4DI integration circuit.

Figure 1:
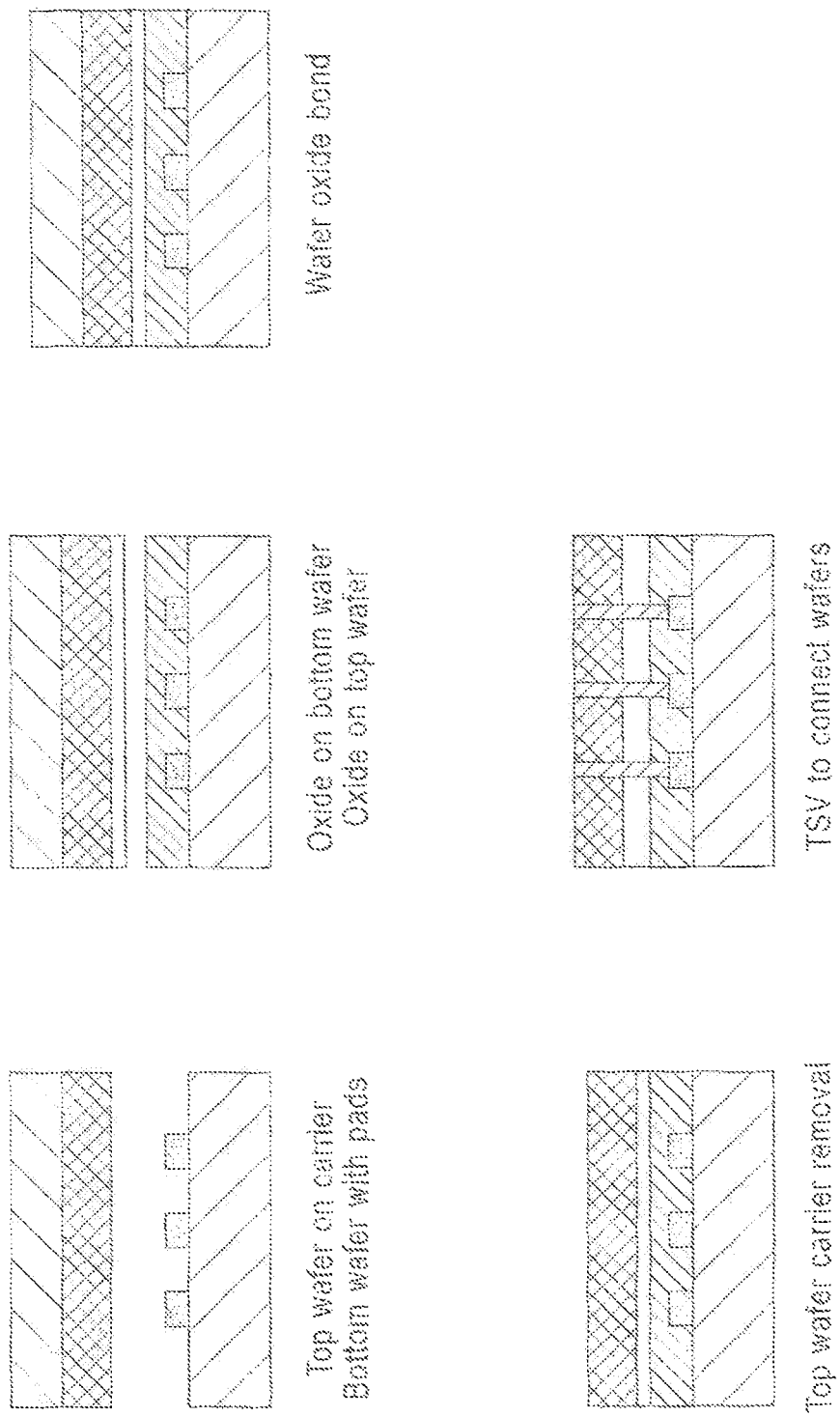
FIG. 1 discloses preparing a wafer level bond-first via last process with oxide bond.
Figure 2:
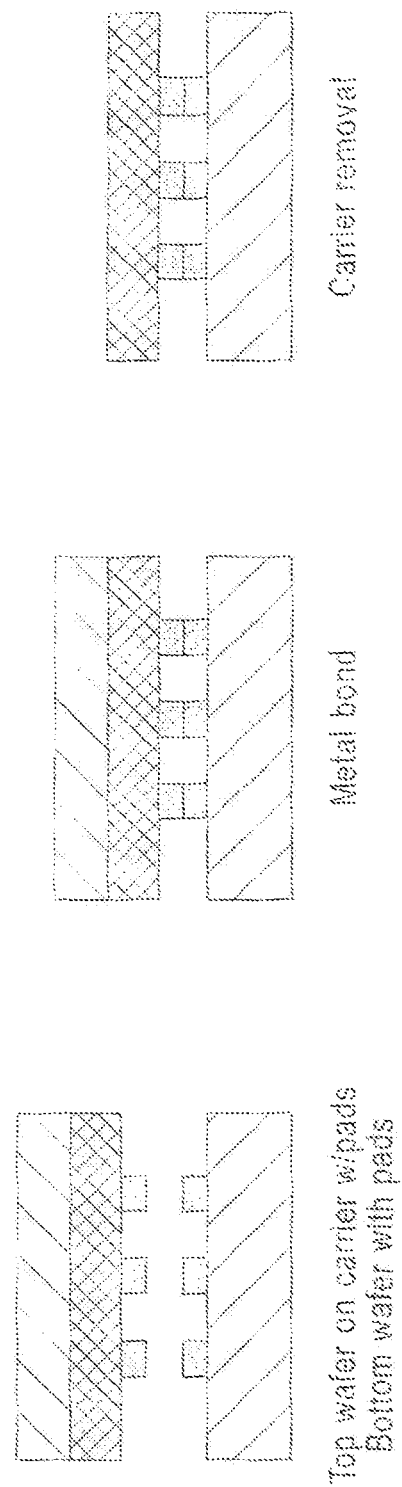
FIG. 2 discloses a wafer level metal bond.

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENT

To achieve these and other advantages, and in accordance with the purpose of this invention as embodied and broadly described herein, the following detailed embodiments comprise disclosed examples that can be embodied in various forms.

The specific processes compounds, compositions, and structural details set out herein not only comprise a basis for the claims and a basis for teaching one skilled in the art to employ the present invention in any novel and useful way, but also provide a description of how to make and use this invention.

The novel polymer composite systems of the present invention are formulated by processing carbon nanotubes (CNT's) of a tailored length range with specially selected high temperature, stable, copper metal compatible polymer base resin.

Carbon nanotubes (CNTs) are allotropes of carbon with a cylindrical nanostructure. CNTs are members of the fullerene structural family possessing a long, hollow structure with the walls formed by one-atom-thick sheets of carbon, called graphene. These sheets are rolled at specific and discrete ("chiral") angles, and the combination of the rolling angle and radius decides the nanotube properties; for example, whether the individual nanotube shell is a metal or semiconductor. The bonding structure is composed of $sp^2$ bonds provides CNTs with their unique strength.

Nanotubes are categorized as single-walled nanotubes (SWNTs) and multi-walled nanotubes (MWNTs). Individual nanotubes naturally align themselves into "ropes" held together by van der Waals forces, more specifically, π-stacking.

Any other suitable method to provide organized architectures of carbon nanotubes as presently practiced are contemplated as being within the scope of the present invention.

CNTs have diverse applications due to their electrical, magnetic, non-linear optical, mechanical and thermal properties. Accordingly, they can be insulating, semiconductive or metallic in nature. The present invention uses the CNTs for their thermal conductivity.

It has been shown that a heat conduction coefficient of a carbon nanotube can be 6600 W/m-K (watts/meter-Kelvin) at room temperature. Nanotubes have two dimensions on the nanoscale, i.e., the diameter of the tube is between 0.1 and 100 nm; its length could be much greater.

Generally the length of each CNT used in accordance with the present invention is 1 µm to 30 µm, or more preferably, between 5 µm to 10 µm. In various embodiments, the carbon nanostructures are formed with a density of between $10^{+10}$ to $10^{+11}$ nanostructures/$cm^2$.

CNT also has a slightly negative thermal expansion, $(-3\times10^{-6})$/K at 350° C. which becomes positive at temperatures in excess of 600° C. Polymers normally have a high CTE of about $(50\times10^{-6})$/K. Since CNT also has a higher modulus than polymers, it is expected the CNT/polymer composite to have a reduced overall CTE, close to that of Si $(3\times10^{-6}$/K. A lower overall CTE helps to reduce internal stress in wafer stacks, therefore the overall wafer bending.

The CNT's can be harvested from a separate growth substrate and mixed into the polymer precursor resin. Alternately, the CNT's can be grown to a desired height at locations on one of the device sublaminates and backfilled with the polymer resin.

"Backfill materials" or "backfill layers," as opposed to "spin coated layers" refers to layers of materials that fill in irregular or structured skeleton frames/supports surfaces or volumes to produce a new surface volume, (similar to casting) that may be used as a base to build additional layered elements and is thermally stable. A key aspect of the proposed invention is to keep the length scale of the CNT's to be substantially equal to the final bonded adhesive layer thickness so as to maximize the chance of CNT's straddling the adhesive bond line with their length. This aspect is more clearly realized if the CNT's are grown in situ on one of the sublaminates with a vertical growth orientation. The CNT's can be optionally treated or functionalized to enable intimate wetting and mixing with the polymer resin medium. Possible treatments include but not limited to plasma activation, UV ozone treatment, exposure to silylation agents and combinations thereof.

Another reason that a fixed length CNT is used is to maintain a high thermal conductivity. Heat conduction (phonon propagation) thru a single CNT form one end to the other is most efficient. If a phonon has to pass two CNTs, then the efficiency is greatly reduced, the phonon cannot easily jump from one CNT to another. Therefore, keeping a fixed length and direction of CNT in the structure is necessary to maintain a good thermal conduction. A randomly distributed CNT matrix cannot provide the required thermal conduction.

The goal is to render the CNT's wettable by the solvent and the polymer resin precursor to enable good mixing and filling, without destroying the desirable high thermal conductivity of CNT's.

Another key aspect of using a polymer-CNT mixtures is that since both components are carbon based, patterning processes such as RIE using plasma chemistries suitable for etching organic materials can be used to generate via or contact holes in the composite layer without resulting in micromasking issues as may be the case when the more commonly employed inorganic fillers are used to impart high thermal conductivity are used.

Polymer resin systems that can be used in the adhesive can be selected from many options. Given the requirements of stability at 400° C. and above, there are a number of polymer classes that would work. Many of these types of high temperature polymers are very insoluble and are applied either as precursor materials or as prepregs. The term "precursor" refers to a monomer or system of monomers that have been reacted to an intermediate molecular mass state. This material is capable of further polymerization by reactive groups to a fully cured high molecular weight state.

The prepregs (i.e., a strong composite material made of woven fibers bonded with resin) used are not the typical pre-impregnated composite fibers where a matrix material, such as an epoxy or phenolic resin found in the prior art.

Some readily soluble systems include polyimide made from precursors of polyamic esters which are not corrosive to copper and can be easily imidized to form the final film. In addition, the class of polyether imides are often soluble in imidized form.

One polyimide to be used in accordance with the present invention is the condensation polymer which is the reaction product of pyromellitic dianhydride and 4,4'-oxydianiline, (PMDA-ODA).

Another imide condensation polymer is poly(4,4'-oxydiphenylene-pyromellitimide) which is the condensation product of pyromellitic dianhydride and 4,4'-diaminodiphenyl ether. This polymer is especially useful when used in accordance with the present invention as its synthesis is an example of the use of a dianhydride in step polymerization. In the course of the polymerization reaction, a useful intermediate polymer, known as poly(amide acid) can be obtained which can be subjected to a soft bake followed by a final cure resulting in the imide ring closure to form the final polyimide product.

Figure 4:
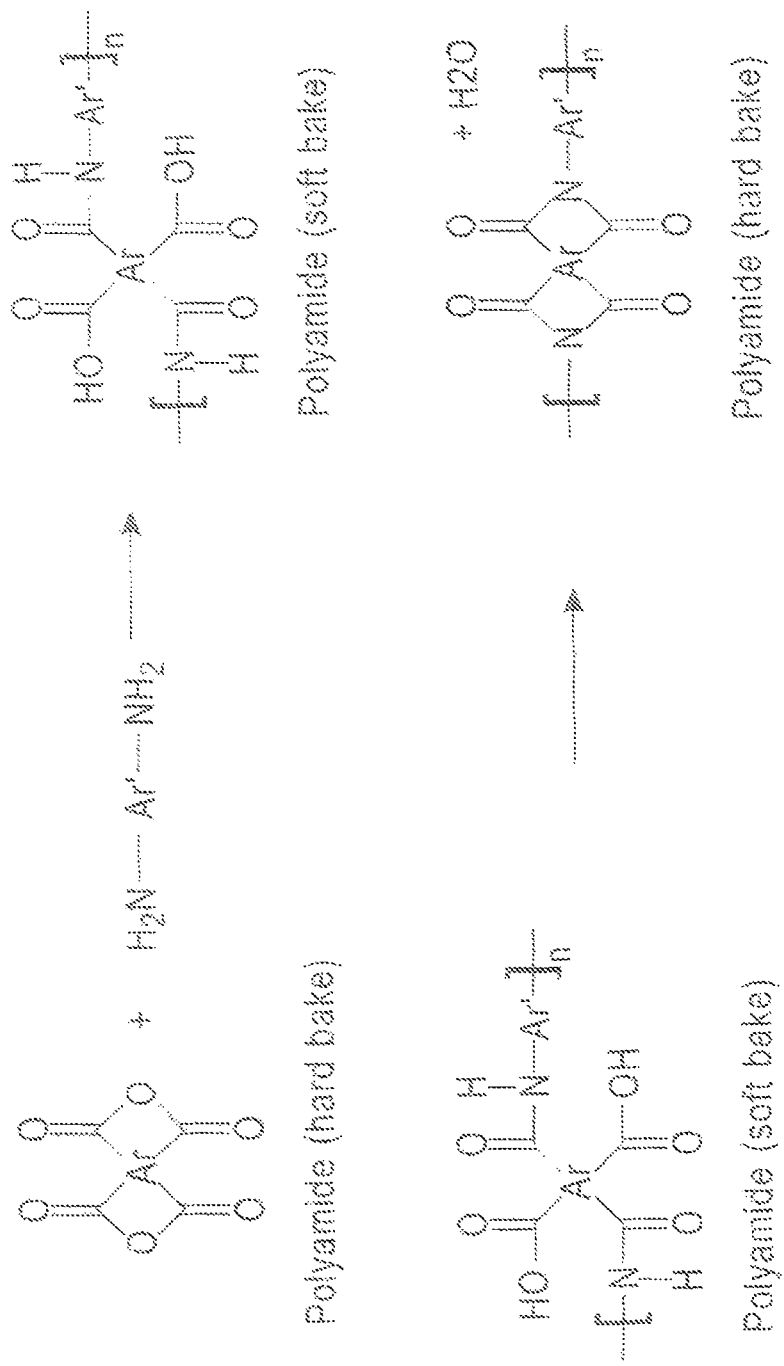
FIG. 4 discloses the general reaction to form polyimides.
Figure 5:
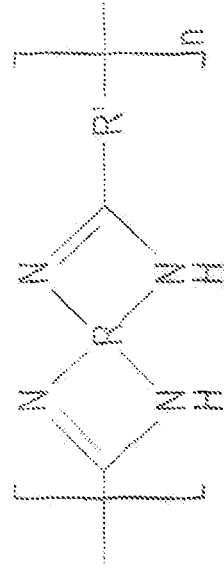
FIG. 5 discloses the various compounds that can form polybenzimidazole.
Figure 6:
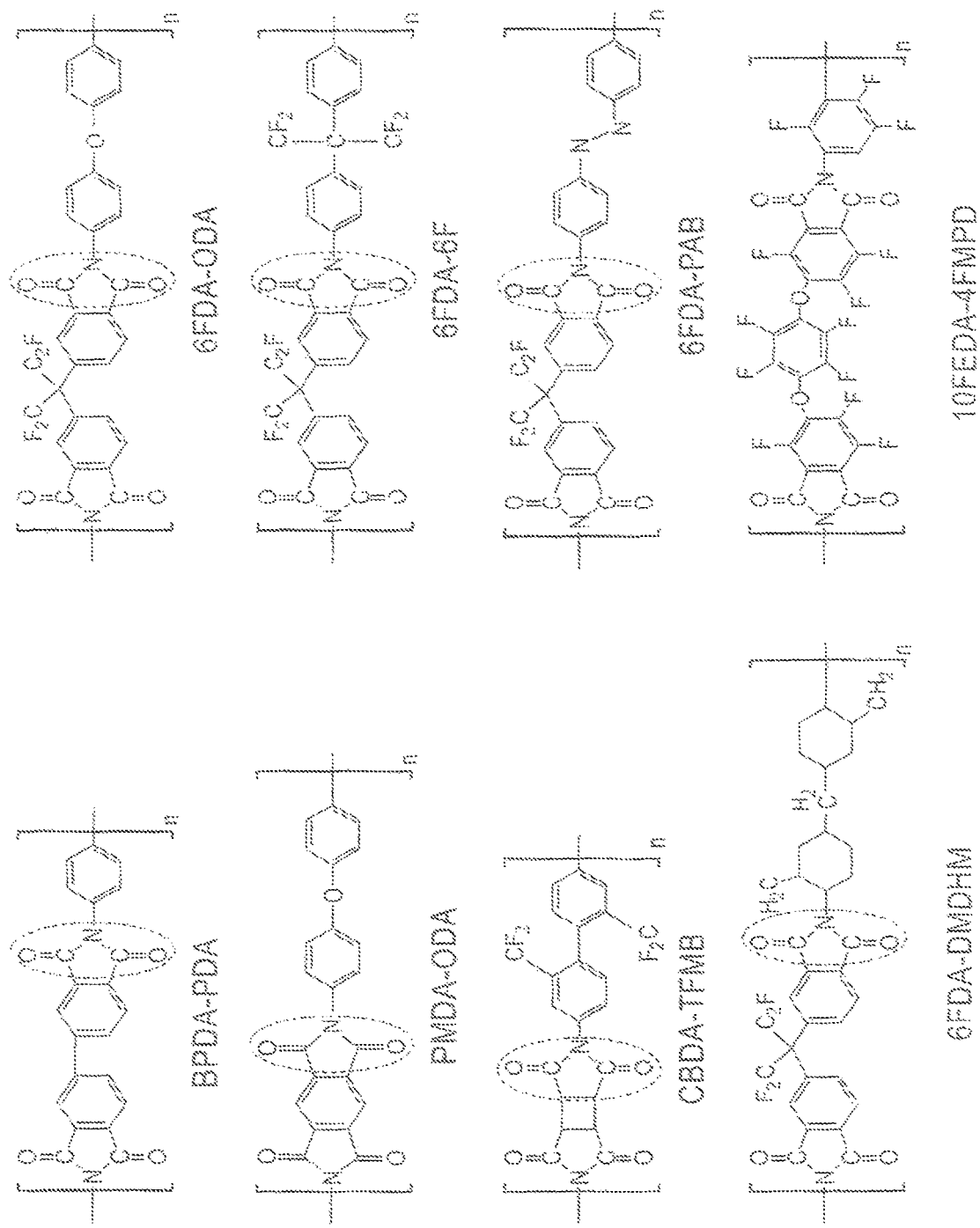
FIG. 6 discloses specific polyimides as disclosed generally in FIG. 5.

FIG. 4 discloses the reactants and reaction products in the preparation of the polyimide described above. FIG. 5 is a generic disclosure of reactions that can be used to prepare the polyimides of the present invention, wherein R is a Teramine and R' is an aryl group.

The $T_g$s of the polyetherimides listed can be increased using stiff aromatic diamines and by incorporating acetylenic terminators which crosslink at high temperatures without gas evolution. In fact these types of crosslinking agents are easily inserted in condensation polymers simply by varying the stoichiometry. Appropriate thermosetting crosslinkers are substituted acetylenes, benzocyclobutenes, biphenylenes, isocyanates etc. Another efficient crosslinker is the trialkoxysilyl group although it is hydrolytically labile.

The specific identity of eight other condensation imide polymers that can be effectively used in the composite of the present invention comprise polyimides with various aryl groups such as BPDA-PDA, 6FDA-ODA, CBDA-TFMB, PMDA-ODA, 6FDA-6F, 6FDA-PAB, 6-FDA-DMDHM and 10FDA-4FMPD. The imide link is encircled.

An example of a useful commercial imide polymer is ULTEM, designed by General Electric, which is a thermoplastic polyetherimide high heat polymer having a repeating unit formula $C_{37}H_{24}O_6N_2$ and a molecular weight approximating 592 g/mol.

The polymer composite adhesive layer containing, e.g., a polyimide, CNTs and coupling agents (as detailed below), has a $T_g$ and $T_m$ to allow flow during lamination without thermal decomposition.

Other polymers of utility are the polybenzazoles, particularly the polybenzoxazoles (PBO) and polybenzimidazoles (PBI). The latter are also known passivators for copper metallurgy.

Fully aromatic derivatives are usually insoluble in organic solvents but are usually applied as a prepolymer.

A polybenzimidazole can be prepared from the reacting isophthalic acid with diamino benzene. The reaction product thereof is subject to cross linking.

In the case of PBO derivatives the precursor is prepared from an aminophenol and, inter alia, an aromatic acid chloride.

Polybenzoxazoles were originally considered as organic low-k dielectric materials (s electronic grade passivation layer, such as HD-4000 series from HD Microelectronics). One example for bulk fibers grade is Zylon® made by Toyoba Corp. which is a high strength PBO. Zylon® is poly(p-phenylene-2,6-benzobisoxazole).

Other cyclized candidates would be isoimides which rearrange to polyimides upon heating and polyamide imides. Such materials are also available commercially from Toyoba in various solvents and are thermally stable. Crosslinking substituents of the type mention above can easily be incorporated.

Perhaps the most promising class of high temperature polymers is the polyarylene and polyarylene ethers. SiLK™ made by Dow Chemical is an example of the former and is sold as a thermosetting material which is readily cast from solution. It crosslinks around 370° C. and is thermally stable to 450° C. it also adheres to most back end of the line (BEOL) surfaces of interest without any need for an adhesion promoter.

If a thermally efficient polymer in the range of stability of between about 350° C. to about 375° C. is adequate, a suitable polymer is the commercially available thermoset Cyclotene® also sold be Dow Chemical. Cyclotene® B-staged divinylsiloxane-bis-benzocyclobutene resin which contains (>/=60.0-</=66.0%), 1,3,5-Trimethylbenzene, (>/=30.0-</=40.0%) and Quinoline, 1,2-dihydro-2,2,4-trimethyl-polymers, (>/=0.1-</=5.0%).

Other interesting examples are the polyarylene ethers which are very thermally stable, can be cast from organic solvents, have good adhesive properties and can be prepared with crosslinking substituents.

Schumacher/Air Products makes a low k version (Velox) and Honeywell has a comparable offering (Flare). Other suitable materials to be used in accordance with the preset invention are would be polyetheretherketones (PEEK) and polyarylether ketones (PAEK). It is permissible that the aforementioned materials are soluble in organic solvents. The aforementioned polymers are thermally stable, and the incorporation of crosslinking substituents in these polymers is simple.

A final class of materials is the polynorbornenes. There are two types of norbornene polymers; one where the ring is retained and one where the ring is open. He first type is generated by coordination cation initiators such as nickel, palladium, metallocenes, etc. These polynorbornenes have high thermal stability, are all hydrocarbon, have high Tgs materials (>300° C.) with thermal stability to about 400° C. These type polynorbornenes are commercially supplied by Promerus and Topas.

The second type of ring opened norbornene polymers is conveniently prepared from norbornene monomers using ring-opening metathesis polymerizations (ROMP) using inter alia, the Grubbs' catalyst. The product resulting from the ROMP process is usually hydrogenated as well. These type norbornene polymers with open rings are often generically called cycloolefin polymers (COP) and have $T_g$ values and thermal stability properties lower than the ring retained polynorbornenes discussed above. The COPs described above are commercially supplied by Materia, Zeon, etc.

The two types of polynorbornenes listed above may not be all hydrocarbon. In fact it is the substituents that allow for the variation in thermomechanical properties. The polynorbornenes can be functionalized to produce thermosets, so, if desired, they can be vitrified by heat, light, ionizing radiation and hence can be patternable by irradiation which is an added benefit as a patterned adhesive layer may be desired.

Commercially available high temperature polymers suitable for use in the present invention include Celazole a polybenzimidazole by PBI, HD4004 a polyimide by HDM, Cyclotene, a benzocyclobutene by Dow, Zylon a polybenzoxazole, Torlon, a polyamideimide by Solvay, Ultem an Extem, both polyetherimides by SaBIC.

One objective of the present invention is to promote adhesion so that the CNT filled polymer composite system is conducive for use in 3D and 4D integration for joining device sub-laminate layers. Polymers in general, and those used in accordance with the present invention have hydrophobic surfaces with weak bonding to other materials surfaces.

As a result of this property, special surface treatment of the polymers with chemicals is required to enhance the bonding strength. Surface treatment chemicals are coupling agents or adhesion promoters consisting of long chain molecules with different chemical ends to link the two contacting materials. The interaction of the polynuclear aromatics used in accordance with the present invention with CNTs is substantial. Many of the polymers cited in this disclosure have aromatic rings (e.g., polyazoles, polyimides, polyarylenes, polyarylene ethers, etc.).

The polynorbornenes and COPs do not have this interaction and may require surface functionalization. Depending upon the circumstances, surface functionalization might be beneficial for the other polymers included in this invention.

Depending on the specific bonding process, temperature needs as well as the post-bonding back end of the line (BEOL) process temperatures to be tolerated, one can choose from a plethora of adhesive systems.

The basic function of an adhesion promoter is to form a compatible interface between two otherwise incompatible materials. Generally, the mechanism of adhesion may derive from condensation of e.g., silanes with surface oxygen atoms or hydroxyl groups. In such event, the surface of the metal or inorganic material is then covered with an organosilane, with the organic portion facing outward. This renders the surface more compatible with an organic polymer.

In the present invention, the adhesion promoter facilitates the polymer fill and bonds to the "forest" of CNTs. The ideal adhesion promoter for use in the present invention is a molecule that has one end with a group that can adhere to metal, a spacer entity for extension and an opposite end that possesses an organo functional group. The preferred organo functional group on the end of the coupling agent is an amino ($NH_2$) group for imide or methyl ($CH_3$) polymers. One coupling agent meeting these requirements is an aminoalkoxysilane such as Si—(—OHRO—)$_3$—($CH_2$)$_3$—$NH_2$.

Other suitable adhesion promoting coupling agents are (3-aminopropyl)triethoxysilane, p-aminophenyltrimethoxysilane3-[2-(2-aminoethylamino)ethylamino]propyl-trimethoxysilane. In addition, organic titanates can be used, such as TYZOR® by Dorf Ketal or Ken-React by Kenrich which is 4-Ti[2-propanolato-tris(3,6-diaza)]hexanolato.

Table 1 discloses suitable coupling agents for different materials with different ends.

TABLE 3

ORGANOSILANES SURFACE MODIFIERS

| REAGANT | CHEMICAL FORMULA | | |
|---|---|---|---|
| | Functional Group | Spacer | Trialkoxy |
| 3-methacryloxy-propyl-trimethoxysilane * | $Ch_2$=C($CH_3$)COO— | ($CH_2$)$_3$ | Si($OCH_3$)$_3$ |
| Vinyl1-trimethoxysilane | —CH—$CH_2$ | | Si($OCH_3$)$_3$ |
| 3-Isocyanate-propyl-triexthoxysilane | —N—C—O | ($CH_2$)$_3$ | Si($OCH_2CH_3$)$_3$ |
| 3-Mercapto-propyl-trimethoxysilane | —SH | ($CH_2$)$_3$ | Si($OCH_2CH_3$)$_3$ |
| 3-Amino-propyl-triethoxysilane | —NH | ($CH_2$)$_3$ | Si($OCH_2CH_3$)$_3$ |

* By way of illustration, 3-methacryloxy-propyl-trimethoxysilane (APTES) and variations thereof with —$NH_2$ end can be used as a surface adhesion promoter for polybenzimidazole due to its azole nitrogen. APTES can be used as a surface treatment agent and when appropriate, as a chemical suspension (emulsion) in a solution.

Coupling agents used in accordance with the present invention can be mixed as part of the polymer solution. In the preferred embodiment of the present invention, the polymer resin contains the coupling agents.

The coupling agent can also be applied separately onto the polymer. In this case the coupling agent is coated and dried on the polymer.

In both cases, a surface cleaning in oxygen plasma to remove surface organics is needed.

The starting point for the process for preparing the high temperature carbon nanotube polymer composite of the present invention is a base wafer 2 formed of suitable material such as silicon as shown in FIG. 7. A layer of photoresist (not shown) is applied to the upper surface of the wafer 2 and patterned before a deep reactive-ion etching (DRIE) process is used to create a trench for in which contact 3, usually Al, Cu or W, alloys (e.g., $Al_xCu_y$) or other suitable similar metals, is implanted.

FIG. 8 shows an insulating oxide layer 4 comprised of a dielectric material such as $SiO_2$, $Si_3N_4$, or $SiO_xN_y$ has been blanket deposited using a CVD or LPCVD method so that it has a thickness in the range of 50 to 500 nm, or preferably 100 nm and covers the exposed base wafer upper surface 2 and contact 3. The insulator layer prevents a short in the system when the top, bottom and sides of the CNTs are in place. Once applied, the dielectric layer may then be anisotropically etched with RIE to remove the unwanted portions.

There are various methods of production of carbon nanotubes such as production of nanotubes by are discharge, chemical vapor deposition, laser ablation, flame synthesis, high pressure carbon monoxide (HiPco), electrolysis, pyrolysis etc.

The chemical vapor deposition (CVD) method may be conveniently used for synthesis of carbon nanotubes. This method is capable of controlling growth directions on a substrate and synthesizing a large quantity of carbon nanotubes. In the CVD process a mixture of hydrocarbon gas (ethylene, methane or acetylene) and a process gas (ammonia, nitrogen, hydrogen) is made to react in a reaction chamber on heated metal substrate at temperature of around 700° C.-900° C., at atmospheric pressure. CNTs formed as a result of decomposition of hydrocarbon gas and deposit grow on metal catalyst (substrate). The catalysts particle can stay at the bottom or top of growing carbon nanotube.

The use of the catalyst in the preparation of the CNTs is an important factor. The catalyst defines the top growth, density, size, length and direction, that is, the nature and type of carbon nanotubes formed.

The usual substrate material on which the CNTs are formed is silicon, but glass and alumina are also used.

The catalysts used are metal nanoparticles, like Fe, Pt Au, Co and Ni, which can be deposited on substrates by means of electron beam evaporation, physical sputtering or solution deposition.

Porous silicon is an ideal substrate for growing self-oriented nanotubes on large surfaces. The nanotube diameter depends on the catalyst particle size, therefore, the catalyst deposition technique should be chosen carefully to yield desired results.

A variant of CVD known as "plasma assisted CVD" is a process in which a plasma is generated during the process. By properly adjusting the geometry of reactor during plasma assisted CVD, it is possible to grow vertically grown carbon nanotubes.

In FIG. 9, a plurality of individual Ni, Pt or Au metal seeded catalysts 5 are positioned on the exposed surface of oxide layer 4. The diameters of the nanotubes that are to be grown are related to the size of metal catalysts 5. The base wafer substrate 2 with contact 3 is heated to a temperature below 400° C.

To initiate the growth of nanotubes, two gases are bled into a reactor: a process gas (such as ammonia, nitrogen or hydrogen) and a carbon-containing gas (such as acetylene, ethylene, ethanol or methane).

Nanotubes grow at the sites of the metal catalyst; the carbon-containing gas is broken apart at the surface of the catalyst particle, and the carbon is transported to the edges of the particle, where it forms the nanotubes.

FIG. 10 shows the result of the step growing the CNTs. The plurality of CNTs 6 extend upwardly and at uniform fixed length from oxide layer 4 with catalyst 5 at the top or terminal point of the formed CNTs.

In FIG. 11, the plurality of CNTs 6 and catalysts 5 are both enveloped in the high thermal polymer 7 of the present invention. The polymer resin system is applied as filler comprising a prepreg or precursor and has incorporated therein an acetylenic terminator. As noted above, other thermosetting crosslinkers are substituted benzocyclobutenes, biphenylenes and isocyananates.

The next step, the results of which are depicted in FIG. 12, is to remove a sufficient amount of the upper surface of high thermal polymer 7 to expose catalysts 5 to the atmosphere using an ashing process. The catalysts 5 that were present atop CNTs 6 in the composite structure are then removed using a DRIE process as shown in FIG. 13.

Once the catalyst has been removed, the resulting composite structure 10 depicted in FIG. 13 is ready for further processing to provide the three-dimensional and four-dimensional integrated circuit applications as contemplated in the present invention.

FIG. 14 shows composite structure 10 having a lithographic resist upon its exposed upper surface. A DRIE was used to effect a highly anisotropic etch process designed to create a penetration, thus forming a steep-sided trench in the resist with a high aspect ratio.

FIG. 15 shows the composite structure after a DRIE etching a trench to the contact and after removal of the resist.

Once the process for making the composite structure depicted in FIG. 15 has been completed, the structure is ready to be assembled into a 3D integration having joined device sublaminate layers. The filled polymer material of the present invention fills in regions between the wafers.

Structure 10 as depicted in FIGS. 16-20 embodies and includes all of the elements described in FIGS. 7-15.

Memory wafers of the present invention must be accurately stacked. The accurate alignment between wafers can be achieved using a lock/key embodiment, also known in the art as transfer/joining (TJ) connection, in combination with the instant polymer composite adhesive system. A lock-and-key (tongue/groove) structure (See FIG. 20) is formed using a matched stud (top wafer) and a recess (bottom wafer). The elements used in this embodiment are shown in FIG. 16.

As depicted in FIG. 16, the bottom 11 of top wafer 12 has a protrusion 13 (a stud, also called the key) aligned with a recess (a cavity or trench) 14 (the lock) in the polymer composite comprising elements 6 and 7.

Key/lock, also called tongue/groove is just one of the fitting patterns that can be used in accordance with the present invention.

Other useful patterns include dove tails, crosses, circles, and the like. This bonding is also called tier-2 bonding. Key 13 is typically about 2 μm to about 10 μm high and about 1 μm-about 2 μm smaller than the deep trenches for a tighter and accurate fitting. The wafers are bonded together (called tier-1 bonding with the adhesive coating.

The polymer adhesive is normally applied in the lock position: i.e. the top surface of bottom wafer 2 as a bonding layer as well as for receiving registration.

The thickness of this layer is determined by the topography of the wafers, with more topography, the thicker of the level of adhesive to maintain a complete surface contact. This topography is typically 1 μm-10 μm thick.

The polymer composite adhesive is generally applied to the surfaces of key 13. However, based on the metal used for the key, (e.g., copper or tungsten) there may be an occasion to use a thin oxide/nitride to insulate the metal sides and only open the key top for contact.

This is the (thin) encapsulation (<1000 Å) layer to prevent metal leaching (electron-migration) into the polymer.

The top surface of the lock polymer (i.e., the top surface of the filler consisting of the polymer, coupling agent and CNTs that is present on lower wafer 2, after the removal of the catalysts, (See FIG. 12) can be rough and may lose tackiness for bonding. In such case one adds a thin layer of the polymer composite (1000 Å-5000 Å) to overcome the surface roughness and to restore the surface bondability. It is important that a length scale of the CNTs is substantially equal to a final bonded adhesive layer thickness so as to maximize the chance of said CNT straddling an adhesive bond line with said length of said CNT.

The polymer with CNT blend "polymer fill" is the "lock" polymer and, as depicted, is located on top of the bottom wafer. This thickness (1 μm-10 μm) is determined by the bottom wafer topography. After the lithographic and RIE patterning, especially after the removal of catalyst, the "lock" top-surface may lose bonding activity and require re-activation.

The addition of a thin layer of polymer composite as noted above is different from application of a surface adhesion promotor which is used for linking two different materials and is only a monolayer thick. The addition noted is also different from lock polymer wafer topography which is 1-10 um. RIE/etch process roughens and deactivates the lock surface and requires a thin layer of virgin polymer to restore adhesion, which is typically used with the encapsulation polymer or oxide/nitride step depicted in the article shown in FIG. 17, since the lock polymer has been lithographically defined and one cannot recoat the polymer there.

FIG. 17 shows the bottom surface of wafer 12 is coated with polymer 15 and the exposed surface of key 13 is also encapsulated with polymer 15.

The polymer composite 15 on key 13 is for bonding surface modification, i.e., to seal the sides of the key). This layer is very thin, having a thickness of between about 0.1μ and about 0.5 μm. The purpose of this layer on the key is to provide a "virgin (i.e., not crossed-linked or damaged) polymer" to re-activate the bonding surface. In this way during the bonding step, the lock-polymer top-surface will contact this "bondable" layer.

FIG. 18 shows the composite structure wherein the polymer composite (or, if applicable, the oxide insulation) at the "cap" end 16 of key 13 has been removed using a RIE or DREI process.

FIG. 19 shows the identical elements depicted in FIG. 18 with the partially insulated key 13 and open cap 16 spaced within the lock cavity 14.

FIG. 20 shows the assembled structure which has been cured by means conventionally known in the art. The direct contact of the metal stud/via (lock/key) allows a metal bonding with a locally applied pressure. This structure is then ready for the installation of the next wafer.

In the course of preparing the 3D there is a need to cure the high temperature polymers disclosed above. Depending upon the method used in preparing the 3D integrated circuit system, the polymer cure can be a soft cure (partial link) and a hard cure (full link). For example, the CNT/polymer blend undergoes a soft cure during lithographic processes and undergoes a hard cure during wafer bonding. A soft cure is of CNT/polymer is preferred with lock-and-key wafer bonding.

The composite film of any of the above base polymers and CNT fill can be formed by methods described earlier. By appropriately adjusting the CNT loading in the polymer one can achieve an optimum level of bond strength and thermal conductivity.

CNT loading level can range from about 30% by volume to about 80% by volume. The lower limit for the fill level is determined by the thermal percolation threshold of the composite structure which may be experimentally determined for the particular type (Shape, length, multiwall or single wall, etc.) of CNT employed and under the CNT fill morphology (such as CNT fill randomly dispersed in the polymer matrix or highly oriented and aligned nominally normal to the bonding interface, etc.).

Higher thermal conductivity is usually enabled by higher CNT fill level but would need to be balanced against a potential decrease in adhesive strength resulting from the reduced volume fraction of the adhesive polymer phase in the composite. Such tradeoffs can be made in an application specific manner.

The CNT/polymer composite of the present invention is conveniently utilized in the processing of a wafer having a thickness of between about 20 and 50 μm. A temporary glass plate or silicon carrier is bonded to the top of the wafer as a "handler" to facilitate the thinning and handling needed for subsequent processing. After the thinned top wafer is bonded to a "thick" bottom wafer, this "carrier" or "handler" glass is removed.

The temporary bond layer between the handler and the thinned wafer is a consumable CNT/polymer layer and is removed from the final structure after processing. The thin top wafer undergoes high temperature processing to achieve a final product. The high temperature CNT/polymer composite serving as a temporary bonding layer with good thermal conduction and a reduced thermal expansion allows the thinned wafer to maintain its structural flatness.

FIGS. 21-27 depict the steps of using the CNT/polymer of the present invention as a temporary and permanent bonding material. Starting with FIG. 23 a top wafer is etched to form TSVs using a DRIE method (or any other suitable etching process). The top of the wafer with TSVs is coated with a cap and the CNT/polymer composite of the present invention is coated on top of the cap as shown in FIG. 22. This CNT/polymer composite is adapted to form a temporary bond. In FIG. 23 a carrier (silicon, glass, etc.) is attached to the temporary CNT/polymer layer coating, which allows the top wafer to be thinned to match the depth of the TSVs as shown in FIG. 24. The thinned top wafer is then brought close to contact a bottom wafer that has a permanent coating of the CNT/polymer composite as shown in FIG. 25. FIG. 26 shows the assembly of wafers, CNT/polymer composites, TSVs and carrier bonded to form an integral structure. FIG. 27 shows that the carrier and the temporary CNT/polymer composite atop the top wafer have been removed resulting in the finished wafer product.

FIG. 28 illustrates the importance of eliminating a thermal expansion and thermal stress mismatch in the 3DI stacks. The wafer used in the present invention must remain flat (as noted above, <50 um flatness) for it to be acceptable in the tools for processing.

FIG. 28 depicts the structure of the present invention using the CNT/polymer composite of the present invention. When the coefficient of thermal expansion (CTE) of the Si layers and the bonding adhesive differ, then the wafer global flatness/stress also change at different temperatures. FIG. 28 illustrates a wafer assembly 200A of the type depicted in FIG. 27 which has CNT/high polymer composite bonding wafers wherein the CTEs are substantially similar. Wafer assembly 200B illustrates the curvature the results when the CTEs of the wafers and CNT/high polymer composite are greatly disparate.

The art defines 2D as a normal wafer. A 3D comprises 2Ds stacked with TSV connecting the layers. 4D comprises vertical stacked slices through fine pitch TJ edge connections to a logic device. In 4D the vertical slices can be either 2D or 3D. The horizontal logic can also be either 2D or 3D. One useful embodiment provides blank conductor sheets such as a metal sheet about 1 μm to about 20 μm thick, e.g., Cu and the art-known equivalents thereof, are inserted between the vertical components to provide a power/ground connection to the top logic circuit. The metal sheets in this regard are placed using an adhesive to provide the appropriate connection to the device. A power and ground pair can be made with a BEOL on to the chip. They can also be clad with Cu/kapton/Cu sheets with the instant composite adhesive inserted between the 4D chips during lamination.

Thus, in one embodiment the vertically stacked component comprises 3D device slices with TSV within each of the 3D device slices and the 3D devices form 4D stacking without TSV between the 4D devices in a 3D-in-4D format. In this embodiment, the primary 3D comprises traditional 3DI with TSV, 3DI-TSV, whereas a secondary 3DI comprises vertically stacked devices using surface wiring with edge I/O fan-out. The secondary 3DI can comprise a stand-alone device such as memory stacks. The 4DI comprises secondary 3DI with T&J (or other fine pitch connection) connection to a horizontal logic.

FIGS. 29-33 depict the steps in assembling a 4DI structure. FIG. 29 shows a CNT/polymer composite coating atop each of four wafers. The wafers are staked and bonded as shown in FIG. 30.

FIG. 31 shows the stack flipped on edge. FIG. 32 shows a plurality of vertical stacks. FIG. 33 shows the vertical stack with a chip attached at an upper edge of said stack.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form.

In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed.

Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While all of the fundamental characteristics and features of the present apparatus of the disclosed invention have been described herein, with reference to particular embodiments thereof, a latitude of modification, various changes and substitutions are intended in the foregoing disclosure and it will be apparent that in some instance, some features of the invention will be employed without a corresponding use of other features without departing from the scope of the invention as set forth.

It should be understood that any such substitutions, modifications, and variations may be made by those skilled in the art without departing from the spirit or scope of the invention. Consequently, all such modifications and variations are included within the scope of the invention as defined by the following claims.

All scientific journal articles and other articles, including internet sites, as well as any patent or patent application that this written description mentions including the references cited in such scientific journal articles and other articles, including internet sites, and such patent or patent application, are incorporated herein by reference in their entirety and for the purpose cited in this written description and for all other disclosures contained in such scientific journal articles and other articles, including internet sites as well as any patent or patent application and the aforesaid references cited therein, as any one may bear on or apply in whole or in part, not only to the foregoing written description, but also the following claims, abstract of the disclosure, and appended drawings.

Although the inventors have described their invention by reference to other embodiments, other embodiments defined by the doctrine of equivalents are intended to be included as falling within the broad scope and spirit of the foregoing written description, and the following claims, abstract of the disclosure, and appended drawings.

What we claim and desire to protect by Letters Patent is:

1. A method of making a polymer based composite system for an electronic device, comprising:
    forming a dielectric layer over a device sublaminate;
    depositing metal catalyst nanoparticles at a plurality of sites on a top surface of the dielectric layer;
    growing a plurality of carbon nanotubes over the device sublaminate at the plurality of sites to a uniform length and in a vertical growth direction, thereby causing the metal catalyst nanoparticles to be positioned at top portions of the carbon nanotubes;
    backfilling the plurality of carbon nanotubes and the metal catalyst nanoparticles with a polymer base resin, the polymer base resin having a thermal stability of 350° Centigrade or above and being compatible with copper, the plurality of carbon nanotubes and the polymer base resin forming a composite layer;
    removing an upper portion of the polymer base resin, thereby causing the polymer base resin to have a thickness substantially equal to the uniform length of the plurality of carbon nanotubes; and removing the metal catalyst nanoparticles.

2. The method of claim 1, wherein the composite layer has a loading level of about thirty percent to about eighty percent by volume of the plurality of carbon nanotubes.

3. The method of claim 2, further including:
incorporating a coupling agent within the polymer base resin to facilitate bonding of the polymer base resin to the plurality of carbon nanotubes.

4. The method of claim 3, wherein the coupling agent includes an amino functional group.

5. The method of claim 2, wherein growing the plurality of nanotubes further includes forming a density of carbon nanotubes between $10^{10}$ to $10^{11}$ nanotubes per square centimeter on the device sublaminate.

6. The method of claim 2, wherein the device sublaminate comprises silicon and the composite layer has a coefficient of thermal expansion of about $3 \times 10^{-6}$/K.

7. The method of claim 2, wherein forming the dielectric layer includes blanket depositing a dielectric material having a thickness in the range of fifty to five hundred nanometers on the device sublaminate and a metal contact embedded within the device sublaminate.

8. The method of claim 7, wherein removing the upper portion of the polymer base resin causes exposure of the metal catalyst nanoparticles and wherein removing the metal catalyst nanoparticles includes etching.

9. The method of claim 8, further including subjecting the composite layer to a soft cure.

10. The method of claim 1, wherein the polymer base resin comprises an imide polymer and a coupling agent comprising an amino group.

11. The method of claim 1, wherein the polymer base resin comprises a polybenzazole polymer.

12. The method of claim 1, wherein the polymer base resin comprises a norbornene polymer.

13. The method of claim 1, wherein the uniform length of the plurality of carbon nanotubes is between 5 μm and 10 μm.

14. The method of claim 1, wherein the polymer base resin comprises a polyarylene polymer.

15. The method of claim 1, wherein the device sublaminate includes a metal contact embedded within the device sublaminate, further including forming a vertical trench within the composite layer extending down to the metal contact.

16. The method of claim 15, wherein:
depositing the metal catalyst nanoparticles includes electron beam evaporation, physical sputtering, or solution deposition.

17. The method of claim 16, wherein removing the upper portion of the polymer base resin causes exposure of the metal catalyst nanoparticles.

18. The method of claim 17, wherein the uniform length of the plurality of carbon nanotubes is between 5 μm and 10 μm.

19. The method of claim 18, wherein the composite layer has a coefficient of thermal expansion about $3 \times 10^{-6}$/K.

20. A method of making a polymer based composite system for an electronic device, comprising:
forming a dielectric layer over a device sublaminate comprising silicon and a metal contact embedded within the device sublaminate;
depositing metal catalyst nanoparticles at a plurality of sites on a top surface of the dielectric layer;
growing a plurality of carbon nanotubes over the device sublaminate at the plurality of sites to a uniform length and in a vertical growth direction;
backfilling the plurality of carbon nanotubes with a polymer base resin, the polymer base resin having a thermal stability of 350° Centigrade or above and being compatible with copper, the plurality of carbon nanotubes and the polymer base resin forming a composite layer; and
forming a vertical trench within the composite layer extending down to the metal contact.

* * * * *